(12) United States Patent
Boomer et al.

(10) Patent No.: US 7,649,480 B2
(45) Date of Patent: Jan. 19, 2010

(54) CALIBRATION CIRCUIT AND ASSOCIATED METHOD

(75) Inventors: Alastair Mark Boomer, Edinburgh (GB); John Paul Lesso, Edinburgh (GB)

(73) Assignee: Wolfson Microelectronics PLC, Edinburgh (GB)

( * ) Notice: Subject to any disclaimer, the term of this patent is extended or adjusted under 35 U.S.C. 154(b) by 8 days.

(21) Appl. No.: 11/987,772

(22) Filed: Dec. 4, 2007

(65) Prior Publication Data

US 2008/0129563 A1    Jun. 5, 2008

(30) Foreign Application Priority Data

Dec. 5, 2006    (GB)    ................ 0624293.7

(51) Int. Cl.
    *H03M 1/10*    (2006.01)
(52) U.S. Cl. ............... 341/120; 341/118; 341/119; 341/121; 341/143; 341/155
(58) Field of Classification Search ......... 341/118–122, 341/139, 143, 155
    See application file for complete search history.

(56) References Cited

U.S. PATENT DOCUMENTS

| | | | |
|---|---|---|---|
| 4,473,846 A | | 9/1984 | Mackereth et al. |
| 4,525,741 A | | 6/1985 | Chahal et al. |
| 4,562,471 A | | 12/1985 | Eouzan et al. |
| 5,105,276 A | | 4/1992 | Schrock |
| 5,270,819 A | | 12/1993 | Watson |
| 5,408,335 A | | 4/1995 | Takahashi et al. |
| 5,745,060 A | * | 4/1998 | McCartney et al. .......... 341/120 |
| 5,864,310 A | * | 1/1999 | Khorramabadi ............. 341/118 |
| 6,005,615 A | | 12/1999 | Tsuda et al. |
| 6,204,787 B1 | * | 3/2001 | Baird ........................ 341/139 |
| 6,285,304 B1 | * | 9/2001 | Schweighofer ............. 341/118 |
| 6,313,769 B1 | * | 11/2001 | Mangahas et al. ........... 341/118 |
| 6,411,232 B1 | * | 6/2002 | Miller et al. ................ 341/120 |
| 6,462,686 B2 | * | 10/2002 | Asano et al. ................ 341/143 |
| 6,603,416 B2 | * | 8/2003 | Masenas et al. ............ 341/120 |
| 6,642,868 B1 | * | 11/2003 | Brown et al. ................ 341/120 |
| 6,791,607 B1 | | 9/2004 | Bilhan et al. |
| 6,940,548 B2 | | 9/2005 | Ying et al. |
| 6,943,627 B2 | * | 9/2005 | Leyonhjelm et al. ........ 330/149 |
| 7,129,867 B2 | * | 10/2006 | Kim et al. ................... 341/118 |

(Continued)

FOREIGN PATENT DOCUMENTS

EP    0 710 011    5/1996

(Continued)

*Primary Examiner*—Linh V Nguyen
(74) *Attorney, Agent, or Firm*—Dickstein Shapiro LLP

(57) ABSTRACT

A calibration circuit and method suitable for black level calibration in image processing, the circuit comprising an analogue gain amplifier, an analogue to digital converter; a correction circuit for receiving a digital signal and providing a digital offset signal; and a digital to analogue converter for receiving said digital offset signal and feeding a corresponding analogue offset signal back to the input of said gain amplifier. The calibration circuit is arranged such that the correction circuit and said digital to analogue converter form a feedback loop applying an offset to said input signal and said correction circuit includes an inverse gain circuit for applying an inverse gain to a signal within said correction circuit prior to said digital to analogue converter. Preferably the inverse gain applied is such that the total loop gain does not deviate too far from unity.

19 Claims, 5 Drawing Sheets

U.S. PATENT DOCUMENTS

| | | | |
|---|---|---|---|
| 7,164,375 B2 * | 1/2007 | Sawada | 341/143 |
| 7,236,117 B1 * | 6/2007 | Varma et al. | 341/155 |
| 2002/0033891 A1 | 3/2002 | Ying et al. | |
| 2005/0237402 A1 | 10/2005 | Sase et al. | |
| 2005/0270197 A1 * | 12/2005 | Smith et al. | 341/120 |
| 2007/0216562 A1 * | 9/2007 | Teo et al. | 341/155 |

FOREIGN PATENT DOCUMENTS

| | | |
|---|---|---|
| JP | 5-344418 | 12/1993 |
| JP | 2002-217658 | 8/2002 |
| WO | WO 92/08315 | 5/1992 |

\* cited by examiner

....

CALIBRATION CIRCUIT AND ASSOCIATED METHOD

This application relates to image signal processing and in particular to black level calibration circuitry and methods.

An imaging sensor, for example a charge coupled device (CCD), comprises a plurality of optical sensing elements, for example photo-diodes, that each represents a pixel. Each sensing element provides pixel data, for example a voltage, representing the intensity of light falling on it. The pixel data is output from the sensor via one or more output terminals.

The pixel data from the sensor is typically sensitive to environmental conditions such as temperature. For example, in a photo-diode, carriers are generated optically and thermally: the thermally generated carriers are indistinguishable from the optically generated carriers and add a component, or an offset, to the desired optical component of the photo-diode's output signal. Not only are the output values of the sensor temperature-dependent, they are also sensitive to manufacturing conditions, and so each sensor varies from one another. However, the plurality of sensing elements on a given sensor are manufactured together and will be subject to the same manufacturing conditions and operating temperature, so the effects of manufacturing and temperature are manifested as a substantially equal shift, for example, an equal d.c. offset voltage in the output of each sensing element.

This d.c. offset uses up part of the input signal range of the circuitry, for example an analogue-to-digital-converter (ADC), that receives the output of the sensor, which results in a reduction in the useful dynamic range of the system output signal.

FIG. 1 illustrates the concept of "black pixels" and "image pixels". Contained in a sensor are a plurality of "black level sensing elements" 100, each one of which represents a "black pixel", that are optically shielded from any light, optical shielding being one method of generating a "black level" reference. It is these black level sensing elements 100 that are used to track variations in the sensor output. The remaining sensing elements 110 in the sensor 120 shall be referred to as "image level sensing elements" as they each provide an output, i.e. "image pixels", (for example a current, a voltage or a charge) that represents the light falling on part of an image being sensed.

Should the image level sensing elements 110 and black level sensing elements 100 be manufactured together and operated under the same environmental conditions (for example, at the same temperature) each of the black level sensing elements 100 will provide the same output signal as each of the image level sensing elements 110 that are not exposed to any light. Black level calibration circuitry is provided so as to subtract a signal equal to, or representative of, the black level sensing element 100 output signals that are output from the sensor during the calibration period (A) (that is, the "black pixel" period) from each image pixel sensing element 110 output signal during the operational period (B) (that is, the "image pixel" period). This removes the unpredictable and environmentally sensitive component, the d.c. offset voltage for example, from the image pixel sensing element output signals. The subtraction of the black level sensing element output signal (the "black level offset") that has been determined during the calibration period (A) allows subsequent circuitry to be used across a fuller signal range, or even its full signal range, and the output level corresponding to the colour black to be more predictable.

These black level sensing elements 100 and image level sensing elements 110 can be used as part of linear or array type image sensor 120.

The black level calibration circuitry may be formed on either the same single integrated circuit (IC) as the sensing elements 100, 110 and associated output circuitry or as one of more separate ICs, as may any subsequent processing circuitry such as an ADC or circuitry for subsequent digital processing. In the case of an IC, the optical shielding of the black level sensing elements is typically achieved using one or more metal layers.

Other methods of generating a "black level" reference include those in which the imaging sensor senses: a "black calibration strip" i.e. a strip of black tape or paint; or an unexposed image that is hidden, such as by a camera shutter for example. Therefore, there are a number of different methods whereby the black level calibration circuitry can possibly generate a "black level" depending upon the system in which the black level calibration circuitry is being used.

The circuitry following the sensor may contain a gain stage amplifier to amplify, or possibly attenuate, the sensor output signal so as to match the sensor output signal range to the input signal range of the circuitry following the sensor, for example, to span a greater range or even the full input range of an ADC.

It is known for there to be provided a black level correction loop to provide an offset to be applied to the inputted signal prior to this amplification by having a feedback loop around the gain stage amplifier. For accurate offset cancellation, this loop must have a high closed-loop gain and in order to settle accurately during the limited number of available black pixels before the image pixel signal arrives, the loop must have a certain bandwidth and not be excessively under- or over-damped. For a given application and amplifier gain, there will be some optimum or nominal response.

However, the gain stage amplifier is usually configured to allow its gain to be varied, either manually or automatically, to maintain a wide output signal swing. This is despite reductions in the general or maximum brightness of the image being sensed, or to compensate for general variation in the optical sensitivity of the sensor elements, for example. But variation of this amplifier gain will cause a corresponding gain change to be applied to the open-loop gain response. A high amplifier gain will increase the gain-bandwidth causing the loop to be under-damped, or even oscillate when closed. A low amplifier gain may give insufficient open-loop gain or a low bandwidth, leading to an excessive settling time. As the feedback loop incorporates the gain stage amplifier, a known solution is to simply introduce a further amplifier, or attenuator, with a gain value the inverse of this amplifier, so that the overall loop response becomes independent of the amplifier gain setting.

The inverse amplifier may be of similar complexity, power consumption, and area to the gain stage amplifier, including a similar number of gain elements (for example resistors, switches and/or variable switched-capacitor arrays) to provide a gain-independent open-loop gain. Having such a complex inverse amplifier is a drawback, especially in a system that is integrated on a monolithic structure, such as an IC for example. Furthermore, a complex inverse amplifier leads to increased chip area, and also involves additional overheads in the accurate production test of gain for all the settings.

It would be desirable therefore to provide for a black level offset loop without the above drawbacks.

In a first aspect of the invention there is provided a circuit for obtaining a calibrated output signal from an input signal, the circuit comprising: an analogue gain amplifier for applying a gain to said input signal; an analogue to digital converter for converting said input signal to digital form after amplification by said gain amplifier; a correction circuit for receiving a signal derived from the output of the analogue to digital converter and outputting a digital offset signal; and a digital to analogue converter for receiving said digital offset signal and feeding a corresponding analogue offset signal back to the input of said gain amplifier, such that said correction circuit and said digital to analogue converter form a feedback loop applying an offset to said input signal, wherein said correction circuit includes an inverse gain circuit for applying an inverse gain to a signal within said correction circuit prior to said digital to analogue converter.

Said inverse gain may be applied so as to establish a combined gain response applied around said feedback loop within predetermined bounds.

The gain of said gain amplifier may be variable, the circuit further comprising a controller for controlling said inverse gain circuit so as to vary the inverse gain automatically so as to maintain the loop gain factor within said predetermined bounds as the gain of the gain amplifier varies. Said controller may be arranged to vary the gain of the inverse gain circuit more coarsely than the gain of the gain amplifier. Said variation of the loop gain factor around the circuit's feedback loop may be restricted within said pre-determined bounds, wherein said pre-determined bounds enable the feedback loop to maintain stability. The variation of the loop gain factor around said feedback loop may be restricted within 50% of a nominal value to said pre-determined bounds. Said nominal value may be the midpoint of the feedback loop's stability range. In one embodiment, the midpoint of the feedback loop's stability range may be unity and said variation of the loop gain factor around said feedback loop may be restricted within the bounds 0.5 and 1.5.

The number of possible gain values said inverse gain circuit can apply may be a power of two.

Said gain amplifier may be a programmable gain amplifier, the gain being dependent on an input coefficient applied to a control input of the calibration circuit. The number of possible gain values that said inverse gain circuit can apply may be less than the total number of possible input coefficients for said programmable gain amplifier. Said controller may be arranged to use a look up table in order to select the inverse gain to be applied by reference to the coefficient controlling said gain amplifier. Said look up table may be divided into regions, with a single inverse gain factor being selected for all the coefficient values in each region. Said single inverse gain factor for each region may be calculated from the mean coefficient value in that region.

Said inverse gain circuit may be a multiplier. Said multiplier may be a shift-add multiplier.

Said calibrated output signal may be dependent on a target calibration level. Said target calibration level may be settable by a user. Said correction circuit may further comprise a digital adder, said target calibration level being set by addition of a target calibration signal to said signal derived from the output of the analogue to digital converter such that said offset applied to said input signal may be dependent on said target calibration level. Alternatively, a digital adder may be comprised in an output signal path of said circuit, said target calibration level being set by addition of a target calibration signal to said signal derived from the output of the analogue to digital converter, to obtain said calibrated output signal.

Said circuit may be arranged to take a number of iterations, if necessary, in order to perform said calibration wherein a pre-determined delay may be introduced between successive iterations to allow for latency in the calibration circuit. Said latency may be as a result of the delay between the adjustment of the digital to analogue converter and its effect being seen on the output of the analogue to digital converter or to delays in the circuit elements.

The circuit may be specifically designed for setting a black level offset for image processing. Said calibration may be arranged to be performed while specifically designated black pixels are being scanned. Said black-pixels may be arranged to be low-pass filtered in the feedback path.

There may be further provided a manual calibration override for applying an offset directly onto the input signal.

Said correction circuit may further comprise a holding circuit for holding the signal level in the calibration circuit prior to conversion by said digital to analogue converter. Said holding circuit may have a control input for controlling when said signal level should be held. Said holding circuit may comprise a digital accumulator or an integrator.

In a further aspect of the invention there is provided a method for obtaining a calibrated output signal from an input signal prior to amplification by a gain amplifier comprising:
    converting the amplified signal to a digital signal;
    applying an inverse gain factor to a signal derived from said digital signal to obtain a digital offset signal;
    converting said digital offset signal to an analogue offset signal; and using said analogue offset signal to apply an offset to said input signal, thereby to define a feedback loop.

Said inverse gain factor may be applied such that the loop gain factor around said feedback loop stays within predetermined bounds. The gain of said gain amplifier may be variable, and further including controlling said inverse gain factor so as to vary the inverse gain automatically so as to maintain the loop gain factor within said predetermined bounds as the gain of the gain amplifier varies. The gain of the inverse gain factor may be varied more coarsely than the gain of the gain amplifier. Said variation of the loop gain factor around the circuit's feedback loop may be restricted within said pre-determined bounds, wherein said pre-determined bounds enable the feedback loop to maintain stability. The variation of the loop gain factor around said feedback loop may be restricted within 50% of a nominal value to said pre-determined bounds. In one embodiment the midpoint of the feedback loop's stability range may be unity and variation of the loop gain factor around said feedback loop may be restricted within the bounds 0.5 and 1.5.

Said gain amplifier may be a programmable gain amplifier, the gain being dependent on an input coefficient. When applying the inverse gain factor, the number of possible gain values that can be applied may be a power of two and/or may be less than the total number of possible input coefficients for said programmable gain amplifier. A look up table may be used in order to select the inverse gain factor to be applied, depending on the value of said input coefficient of the programmable gain amplifier. Said look up table may be divided into regions, with a single inverse gain factor being selected for all the coefficients in each region. Said single inverse gain factor for each region may be calculated from the mean coefficient in that region.

Said inverse gain factor may be applied using a multiplier. Said multiplier may be a shift-add multiplier.

Said calibrated output signal may be dependent on a target calibration level. Said target calibration level may be settable by a user. Said target calibration level may be set by addition of a target calibration signal to said signal derived from the output of the analogue to digital converter such that said offset applied to said input signal may be dependent on said target calibration level. Alternatively, Said target calibration level may be set by addition of a target calibration signal to said signal derived from the output of the analogue to digital converter, to obtain said calibrated output signal.

A number of iterations may be taken, if necessary, in order to perform said calibration and a pre-determined delay may be introduced between successive iterations to allow for latency in the calibration circuit.

Said method may be specifically performed to set a black level offset for image processing. Said calibration may be performed while specifically designated black pixels are being scanned. Said black-pixels may be low-pass filtered, prior to amplification by the inverse amplifier.

The offset applied to said input signal may be a manually calibrated input signal.

The signal level may be held prior to conversion by said digital to analogue converter.

In a further aspect of the invention there is provided an image capturing system comprising an imaging sensor, a signal conditioning circuit which comprises an analogue gain amplifier for applying a gain to said input signal, a signal conversion circuit which comprises an analogue to digital converter for converting said input signal to digital form after amplification by said gain amplifier, wherein said signal conversion circuit generates, at an output, a calibrated digital signal representing an analogue input signal received from said imaging sensor via said signal conversion circuit, wherein said image capturing system further comprises calibration circuitry for calibrating said input signal, said calibration circuitry comprising: a correction circuit for receiving a signal derived from the output of the analogue to digital converter and outputting a digital offset signal; and a digital to analogue converter for receiving said digital offset signal and feeding a corresponding analogue offset signal back to the input of said gain amplifier, such that said correction circuit and said digital to analogue converter form a feedback loop applying an offset to said input signal, wherein said correction circuit includes an inverse gain circuit for applying an inverse gain to a signal within said correction circuit prior to said digital to analogue converter.

Said inverse gain may be applied so as to establish a combined gain response applied around said feedback loop within predetermined bounds.

The gain of said gain amplifier may be variable, the circuit further comprising a controller for controlling said inverse gain circuit so as to vary the inverse gain automatically so as to maintain the loop gain factor within said predetermined bounds as the gain of the gain amplifier varies. Said controller may be arranged to vary the gain of the inverse gain circuit more coarsely than the gain of the gain amplifier. Said variation of the loop gain factor around the circuit's feedback loop may be restricted within said pre-determined bounds, wherein said pre-determined bounds enable the feedback loop to maintain stability. The variation of the loop gain factor around said feedback loop may be restricted within 50% of a nominal value to said pre-determined bounds. Said nominal value may be the midpoint of the feedback loop's stability range. In one embodiment, the midpoint of the feedback loop's stability range may be unity and said variation of the loop gain factor around said feedback loop may be restricted within the bounds 0.5 and 1.5.

The number of possible gain values said inverse gain circuit can apply may be a power of two.

Said gain amplifier may be a programmable gain amplifier, the gain being dependent on an input coefficient applied to a control input of the calibration circuit. The number of possible gain values that said inverse gain circuit can apply may be less than the total number of possible input coefficients for said programmable gain amplifier. Said controller may be arranged to use a look up table in order to select the inverse gain to be applied by reference to the coefficient controlling said gain amplifier. Said look up table may be divided into regions, with a single inverse gain factor being selected for all the coefficient values in each region. Said single inverse gain factor for each region may be calculated from the mean coefficient value in that region.

Said inverse gain circuit may be a multiplier. Said multiplier may be a shift-add multiplier.

Said calibrated output signal may be dependent on a target calibration level. Said target calibration level may be settable by a user. Said correction circuit may further comprise a digital adder, said target calibration level being set by addition of a target calibration signal to said signal derived from the output of the analogue to digital converter such that said offset applied to said input signal may be dependent on said target calibration level. Alternatively, a digital adder may be comprised in an output signal path of said circuit, said target calibration level being set by addition of a target calibration signal to said signal derived from the output of the analogue to digital converter, to obtain said calibrated output signal.

Said circuit may be arranged to take a number of iterations, if necessary, in order to perform said calibration wherein a pre-determined delay may be introduced between successive iterations to allow for latency in the calibration circuit. Said latency may be as a result of the delay between the adjustment of the digital to analogue converter and its effect being seen on the output of the analogue to digital converter or to delays in the circuit elements.

The circuit may be specifically designed for setting a black level offset for image processing. Said calibration may be arranged to be performed while specifically designated black pixels are being scanned. Said black-pixels may be arranged to be low-pass filtered in the feedback path.

There may be further provided a manual calibration override for applying an offset directly onto the input signal.

Said correction circuit may further comprise a holding circuit for holding the signal level in the calibration circuit prior to conversion by said digital to analogue converter. Said holding circuit may have a control input for controlling when said signal level should be held. Said holding circuit may comprise a digital accumulator or an integrator.

Said system may further comprise an output device.

Said system may form part of a scanner, part of a photocopier, or part of a multi-functional device capable of copying, scanning, storing, transmitting and printing images.

BRIEF DESCRIPTION OF THE DRAWINGS

Embodiments of the invention will now be described, by way of example only, by reference to the accompanying drawings, in which:

FIG. 3b shows an alternative embodiment of calibration circuit of FIG. 3a;

FIG. 5 is a timing diagram for the circuit of FIG. 3a;

DETAILED DESCRIPTION OF THE EMBODIMENTS

Figure 2:
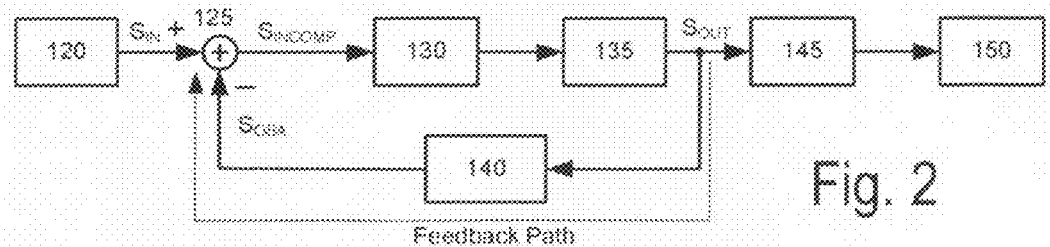
FIG. 2 illustrates a block diagram of an image processing apparatus.

FIG. 2 illustrates a basic block diagram of a system for processing an image, such as that found in digital still and video cameras, scanners or photocopiers (or, as is increasingly common, a multi-functional devices capable of copying, scanning, storing, transmitting and printing images). The system comprises an imaging sensor 120, an analogue adder stage 125, a programmable, i.e. variable, gain amplifier (PGA) stage 130, an analogue-to-digital conversion (ADC) stage 135, a calibration stage 140, a processor stage 145 and an output device 150. The output device 150 may be a electrostatic printing mechanism, ink printing mechanism, transmitter, storage or display device or any other suitable device.

During normal operation, i.e. during period (B), the imaging sensor 120 is used to sense a target object, that is an image. As the image is being sensed, the gain stage 130 amplifies the analogue signal $S_{IN}$ from the imaging sensor 120. The resultant amplified analogue signal is then converted into a digital signal $S_{OUT}$, that is the digital data, by the ADC 135 and is then passed to the processor 145 for subsequent processing. Once processing is completed, the captured image data is passed to the output device 150 for printing/storing/transmitting etc.

As explained with reference to FIG. 1, the imaging sensor 120, during a calibration period (A), may output signals ("black pixels") from the black level sensing elements 100. After this the imaging sensor, during an operational period (B), may output signals ("image pixels") from image level sensing elements 110. This may be done for each line or block of the image level sensing elements 110 depending on the type of image sensor employed.

During the calibration period (A), the system illustrated in FIG. 2 is arranged to calibrate itself, so as to correct for changes in the environment which may affect the general output level of signals from the elements 100, 110 of the imaging sensor 120, for example. This calibration may be done by feeding back, via a feedback path (as illustrated by the dashed line), the signal $S_{OUT}$ outputted from said conversion stage 135 as explained below.

Figure 3A:
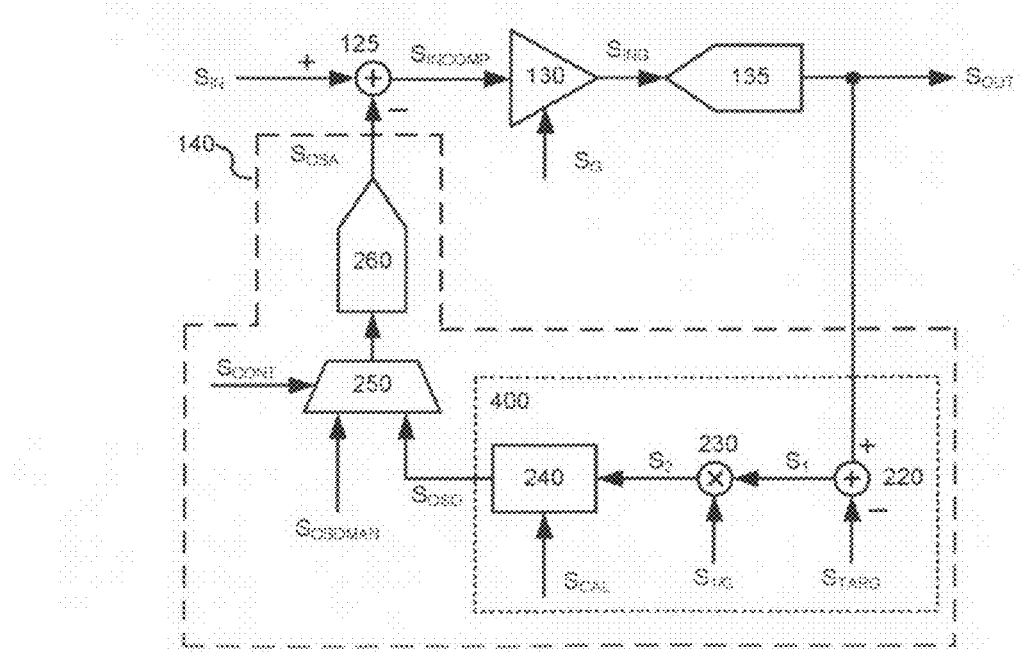
FIG. 3a shows an embodiment of calibration circuit according to the invention.

FIG. 3a shows an embodiment of a calibration circuit 140 suitable for carrying out black level calibration. It comprises: a digital adder 220; a digital multiplier 230; an accumulator 240; a multiplexer 250 (which is optional); and a digital-to-analogue converter (DAC) 260 that are all arranged to define a feedback path between the output of the ADC 135 and an input of the adder 125.

Figure 1:
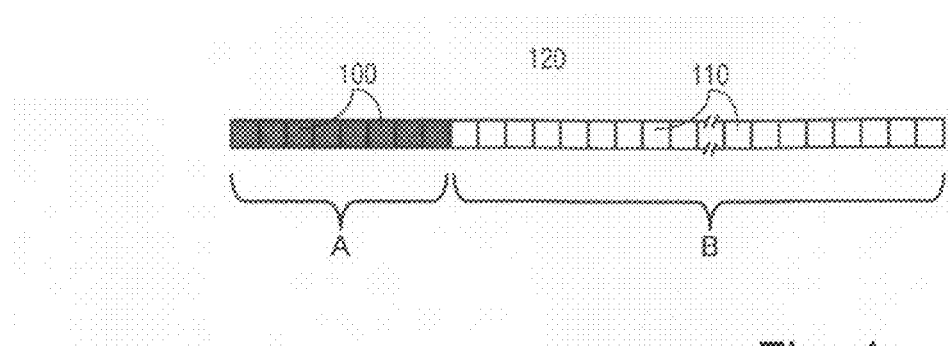
FIG. 1 depicts one line of pixels as seen by an image sensor including a "black pixel" section.

An analogue input signal $S_{in}$ is received from the image sensor 120 (not illustrated) which produces a sequence of black pixel and image pixel output signals representative of those that may be produced during respective calibration and operational periods (A, B) by the sensing elements 100, 110 illustrated in FIG. 1.

During the calibration period (A), the black level calibration circuit 140, together with the adder 125, the PGA 130 and the ADC 135, produces a digital output signal $S_{OUT}$. Signal $S_{OUT}$ is derived from the sum of the input signal $S_{IN}$ from the image sensor 120 and an offset signal $S_{OSA}$, the latter signal being a feedback signal derived from the output signal $S_{OUT}$. The output signal $S_{OUT}$ is therefore corrected, that is compensated, for any d.c. offset in the black pixel level readings. It should therefore be appreciated that the: black level calibration circuit 140; adder 125; PGA 130; and ADC 135 combine to provide a circuit for calibrating the input signal $S_{IN}$. Furthermore, it should be appreciated that the adder 125 could be implemented within, or considered as part of, the PGA 130 or alternatively, the PGA 130 could be arranged to operatively process both the input signal $S_{IN}$ and analogue offset signal $S_{OSA}$ such that it performs the same function as the adder 125 would have.

This feedback path provides feedback control during black level calibration (during operational period (A)) as follows (it should be noted that the following description of black level calibration ignores any latency effects for the purposes of ease of comprehension, and the effects of latency on the operation of the circuit for calibrating the input signal $S_{IN}$ are described in more detail further on in the description).

This signal $S_{IN}$, representing a black pixel that is to be used as part of the calibration process, is amplified by the PGA 130 by a gain factor G, this gain factor being dependent on the PGA's control signal $S_G$. The resultant amplified output signal SING from the PGA 130 is then passed into the ADC 135 which in turn outputs a digital output signal $S_{OUT}$ that represents the analogue amplified signal SING. The digital adder 220 subtracts the digital output signal $S_{OUT}$ from a digital input signal $S_{TARG}$ (that may be preset, automatically generated or defined by a user) representing a target black level value. The resultant signal $S_1$ from the digital adder 220 is multiplied with a signal $S_{1/G}$ by the digital multiplier 230, the signal $S_{1/G}$ representing a gain factor equal to, or substantially equal to, the inverse of the gain factor (G) of the PGA 130. It will be apparent to the skilled person that signal $S_{1/G}$ may be, for example, derived from signal $S_G$ before being inputted to multiplier 230, or that multiplier 230 may have signal $S_G$ inputted directly to it and may then use this to obtain the inverse gain signal $S_{1/G}$ before applying it to signal $S_{1a}$.

The resultant signal $S_2$ output from the digital multiplier 230, is then fed into the accumulator 240 whose function is to add this signal $S_2$ to the previous signal from the digital multiplier 230. It should be noted that it is preferable, in the case where the input signal $S_{IN}$ represents the first black pixel to be processed during a calibration period A, that there is a "default signal" representing signal $S_2$ set or residing within the accumulator 240 such that the output signal $S_{OSA}$ of the DAC 260 is set to a default value between zero and its full-scale. Therefore, the signal $S_2$ set or residing within the accumulator 240 during the processing of the first black pixel represents a "virtual" previous signal value, which may be a value that is close to the known or anticipated black level offset of the sensor 120.

The accumulator 240 outputs a digital offset signal $S_{OSD}$, which is a representation of the analogue offset signal $S_{OSA}$. The analogue adder 125 then adds analogue offset signal $S_{OSA}$ to the analogue input signal $S_{IN}$ which represents the next black pixel sensed by the image sensor 120. Subsequently, a compensated analogue input signal $S_{INCOMP}$ is applied to the input of the PGA 130, the compensated input signal $S_{INCOMP}$ being an offset version of $S_{IN}$. The digital offset signal $S_{OSD}$ is converted into an equivalent analogue offset signal $S_{OSA}$ by the DAC 260. After a number n of clock cycles, due to the iterative nature of the circuit for calibrating the input signal $S_{IN}$, the ADC 135 digital output signal $S_{OUT}$ will converge to the desired value which is set by the digital input signal $S_{TARG}$.

Therefore, it can be appreciated that during the calibration period (A), the input signal $S_{IN}$ is constant, or is substantially constant, since all the black level sensing elements 100 output the same, or substantially the same, voltage that represents the colour "black". It can be further appreciated that the overall objective of the calibration process, in reference to FIG. 3a, is to make the output signal $S_{OUT}$ equal, or substantially equal, to the target value signal $S_{TARG}$ when the input signal $S_{IN}$ is a voltage representing the colour "black".

Just before the first image pixel signal arrives during a subsequent operational period (B), the calibration circuit 140 is controlled, by (in this example) an input control signal $S_{CAL}$ to the accumulator 240, to hold its output signal $S_{OSD}$ constant. It should be appreciated that input control signal $S_{CAL}$ may hold its output signal $S_{OSD}$ constant at times during the calibration period A, as will be described further on in the description. Maintaining a constant digital offset signal $S_{OSD}$, that is maintaining the digital input to the DAC 260 constant, results in the corresponding analogue offset signal $S_{OSA}$ being maintained at a constant value. Therefore, the analogue offset signal $S_{OSA}$, determined during the calibration period A, is applied to each image pixel signal $S_{IN}$ during the operational period B. This produces a series of "black level compensated" image pixel signals $S_{INCOMP}$ that are input to the PGA 130 and subsequently output from the ADC 135 for processing.

The multiplexer 250 is optional circuitry that allows an alternative digital offset signal $S_{OSDMAN}$ to effectively be added to the input signal $S_{IN}$ in place of signal $S_{OSD}$ from the accumulator 240. This alternative offset signal $S_{OSDMAN}$ may, for example, be manually input by a user so as to input an alternative black level calibration value which replaces the calibration circuit generated black level calibration value. A control input to the multiplexer 250 receives an input control signal $S_{CONT}$ that selects whether the DAC 260 converts a black level offset signal that is generated by the calibration circuit 140 ($S_{OSD}$) or is input ($S_{OSDMAN}$) by a user.

Although not illustrated, it is also envisaged that a number of the output samples corresponding to black pixels could be low-pass filtered, instead of or in addition to the integrating action of the accumulator 240, before or after the digital multiplier 230. This provides a more accurate applied offset in the presence of random thermal noise or small random mismatches in the signals from individual black pixels.

Referring to FIG. 3a, it should be appreciated that during the calibration period (A), the compensated signal $S_{INCOMP}$ at the input to the PGA 135 will settle out to be $S_{TARG}/G$ (where G represents the gain factor of the PGA). This signal $S_{INCOMP}$ will thus be disturbed, and will subsequently be required to re-settle, if the PGA 135 gain factor G is altered "on-the-fly", that is altered during a calibration period or between successive calibration periods. Any disturbance and settling requirement due to "on-the-fly" gain factor alteration may be reduced or minimised by setting the target black level input value signal $S_{TARG}$ to zero.

Figure 3B:
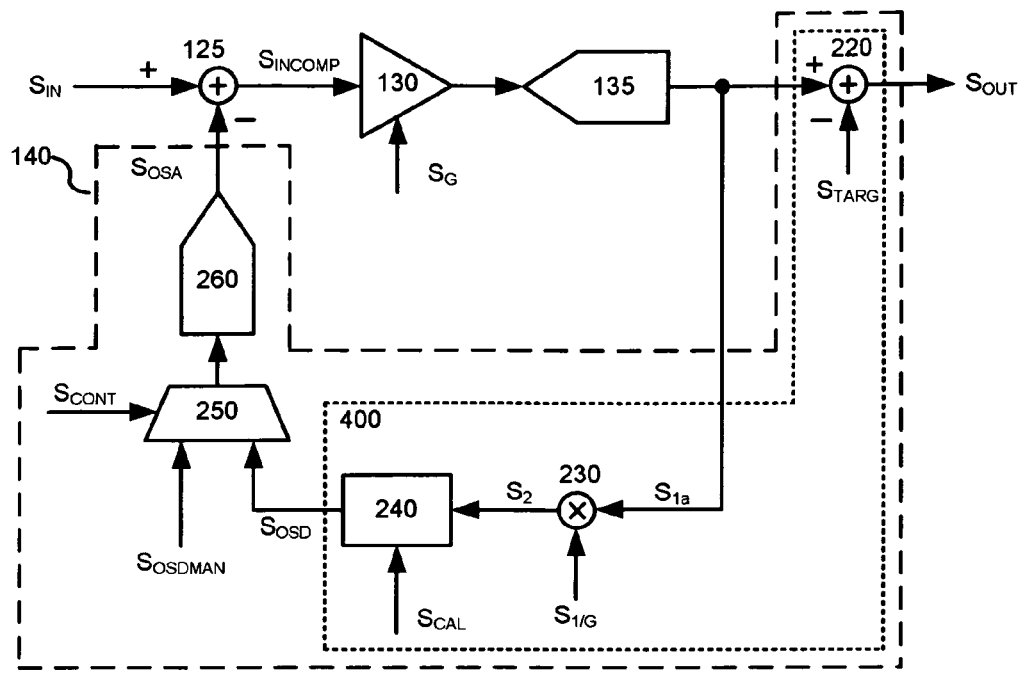

FIG. 3b represents the same circuit for calibrating the input signal $S_{IN}$ as that illustrated in FIG. 3a except that in FIG. 3b the digital adder 220 has been relocated out of the feedback path and is now situated in the signal path between the output of the ADC 135 and the processor stage 145 (not illustrated).

A digital output signal $S_{1a}$ of the ADC 135 is input into the digital multiplier 230 and the relocated digital adder 220. The digital adder 220 also receives the target black level input value signal $S_{TARG}$ as before. Therefore, the digital adder 220 is illustrated as being used downstream from the feedback path and the target black level value signal $S_{TARG}$ is now added as a digital offset to the ADC 135 digital output signal $S_{OUT}$.

Removing the digital adder 220 from the feedback path results in the output signal of the ADC 135 being servoed to zero by the action of the feedback loop. During the calibration period (A) (except for the effect of any small manufacturing offsets in the ADC 135 and PGA 130) the input voltage to the PGA 130 must thus also settle out to zero, irrespective of PGA 130 gain setting. Therefore, relocating the digital adder 220, as illustrated in FIG. 3b, results in this alternative embodiment of the calibration circuit 140 being less sensitive to variations in the gain factor G of the PGA 130. It will be appreciated that such a relocation of the digital adder 220 removes the ability to set the target black level value signal $S_{TARG}$ within the feedback path to any value other than zero, but the black level output of the digital adder 220 will still be the sum i.e. the difference, between the output signal of the ADC 135 and the black level target value signal $S_{TARG}$.

It should be appreciated that the circuitry illustrated in FIGS. 3a and 3b is mixed-signal circuitry, i.e. circuitry that operates on both analogue and digital signals.

Figure 4A:
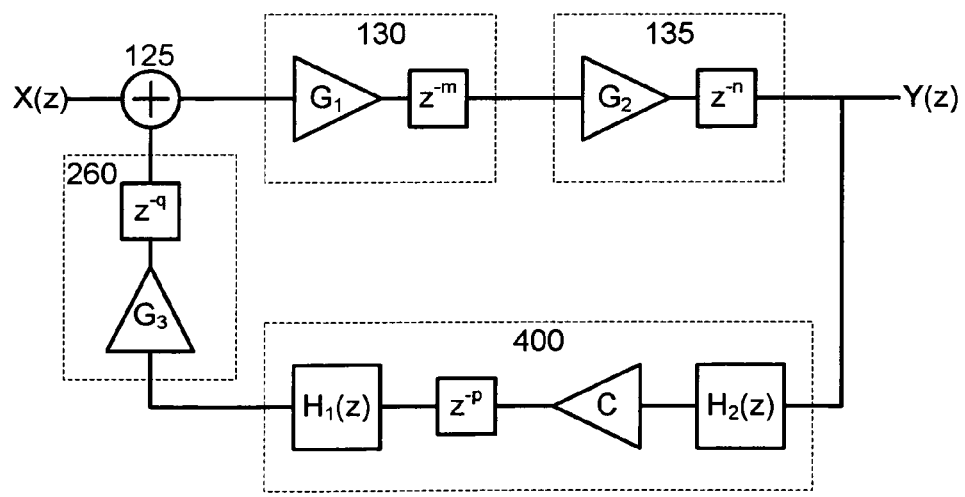
FIG. 4 shows an equivalent circuit of FIG. 3a for analysis.

FIG. 4a shows a control theory representation of the circuit shown in FIG. 3a. The PGA 130, ADC 135 and DAC 260 have each been replaced by a gain term, respectively G1, G2, G3, and a delay term, respectively $z^{-m}$, $z^{-n}$ $z^{-q}$: the delay terms represent the latency in their respective circuit elements. Correction circuitry 400 (that is the digital adder 220, the digital multiplier 230 and the accumulator 240) is made up of: a compensator gain term C and the frequency terms $H_1(z)$ and $H_2(z)$ which represent the accumulator 240 and low-pass filtering as well as any further circuit correction circuitry required, depending on the actual implementation used. The delay term $z^{-p}$ represents the latency introduced by the correction circuitry 400.

Figure 4B:
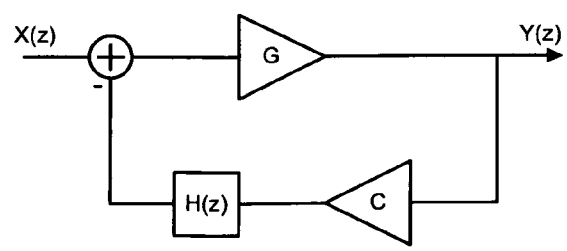

In order to simplify the analysis of the circuit shown in FIG. 4a some further assumptions and approximations have been made, resulting in a simplified circuit as shown in FIG. 4b.

Referring back to FIG. 4a, the latency in the system represented by terms $z^{-m}$, $z^{-n}$, $z^{-p}$ and $z^{-q}$ is assumed, for the purposes of ease of explanation, to be zero or at least substantially negligible.

The gain term $G_1$ is used to represent the PGA 130 gain factor (G), which, by its very nature, has a variable gain dependent on an adjustable coefficient signal $S_G$.

Terms $G_2$ and $G_3$ represent the respective gain terms due to the ADC 135 and DAC 260, the magnitudes of which depend upon, for example, any non-linearity present and on the implementation used for these circuit blocks. For example, the DAC 260 may have a different scaling factor in terms of voltage per least-significant-bit (LSB) to that of the ADC 135 which would result in a non-unity combined gain. The gain resulting from the DAC 260 or ADC 135 may be compensated in various ways including, for example, in the implementation of the additional gain term in the analogue domain. However, for the purposes of this analysis it shall be assumed that $G_2$ and $G_3$ cancel to give unity combined gain and all compensation for PGA gain $G_1$ shall be done by adjusting the gain term C shown in FIGS. 4a and 4b. If the gain product $G_2 \cdot G_3$ is not unity, this can be compensated for by a corresponding scaling of gain term C.

Further simplification of FIG. 4a is to group the frequency terms $H_1(z)$ and $H_2(z)$ together into a single term $H(z)$ as shown in FIG. 4b. This allows a single frequency term to be used in the analysis.

Control loop analysis of the approximated circuit shown in FIG. 4b is shown as follows.

Open Loop gain:

$$\frac{Y(z)}{X(z)} = \frac{G}{1 + G \cdot C \cdot H(z)}$$

Where $$H(z) = \frac{1}{z-1}$$

(for example)

$$\therefore \frac{Y(z)}{X(z)} = \frac{G(z-1)}{z+G \cdot C - 1}$$

Poles: $z+G \cdot C-1=0$
$\therefore z=1-G \cdot C$

For stability poles must lie within unit circle:
$\therefore |z|<1$
$\therefore 1-G \cdot C<1$ and $-(1-G \cdot C)<1$
System is stable if: $0<G \cdot C<2$ It should be noted that in this analysis H(z) is assumed to be a simple integration term $1/(z-1)$. This simplification is for example only and other terms with different characteristics may also be used.

This loop analysis shows that for H(z) of $1/(z-1)$ the loop is stable provided the product of the term $G \cdot C$ remains between the bounds of 0 and 2. The term "loop gain factor" shall denote the term $G \cdot C$, that is the product of the PGA gain and the inverse gain. The target loop gain factor should preferably be the mid-point of the stability range, as this provides the greatest margin from the stability limits. In the control loop analysis example above, the mid-point would be 1, that is unity. Additionally, a target loop gain factor of unity gives a critically damped filter response (in this example). It should be understood that the required range of the loop gain factor in this particular example is between the operational bounds of 0 and 2 in order to ensure stability and that this stability range may not be the same for different implementations of the H(z) term. For example, if the H(z) term in the above control loop analysis equalled $z^{-1}/(1-z^{-1})$ rather than $1/(1-z^{-1})$ then the ideal loop gain factor $G \cdot C$ would be 0.5, that is. the mid-point between 0 and 1. Therefore, the gain term C would equal $0.5/G$, rather than $1/G$. Therefore, it should be noted that the gain term C is inversely proportional to the PGA 130 gain G such that $C=F \cdot (1/G)$ where F is a factor that is less than, equal to or greater than 1 depending on the H(z) implementation of the circuitry used in the design.

There are two characteristics in the feedback loop that require special consideration. These are: (i) latency; and (ii) loop gain factor.

i.) Latency

Latency in the circuitry for calibrating the input signal $S_{IN}$, that is latency in the feedback loop that is made up of the adder 125, PGA 130, ADC 135, circuit elements 220, 230 and 240, of the correction circuitry 400, and DAC 260, may all add phase delay to the open loop response and may thus degrade phase margin. This can cause the output of the DAC 260 to overshoot when hunting for the target black level. To address this, in an exemplary embodiment, the offset DAC 260 is only updated a certain number of clock cycles after the previous update. For example, if the latency is "n" clock cycles, after setting the output signal $S_{OSA}$ of the DAC 260, the digital circuitry within the feedback path, that is the digital domain circuitry within the calibration circuit 140, should wait for n clock cycles before updating, that is resetting, the output signal $S_{OSA}$ of the DAC 260. Therefore, in the example where the input control signal $S_{CAL}$ to the accumulator 240 holds its output signal $S_{OSD}$ constant, the output signal $S_{OSD}$ is held constant for n clock cycles and updated, along with the DAC 260 input, 1 in n clock cycles. $S_{CAL}$, and hence changes in the analogue offset signal $S_{OSA}$, is a function of latency.

Therefore, the effect of latency within the feedback loop can be reduced at the cost of effectively slowing down the operation of the circuitry within the feedback loop. Such an approach is relatively straightforward to implement due to fact that part of the feedback loop is in the digital domain.

In summary calibration is arranged to work as follows, using an iterative approach, where each step in the iteration has the following procedure:

1.) Calculate the adjustment needed to the current DAC 260 analogue output offset signal $S_{OSA}$ value to make the output signal $S_{OUT}$ of the ADC 135 closer to the target black level signal $S_{TARG}$;
2.) Make adjustment to the DAC 260;
3.) Wait for the required number (n) of clocks for the latency between adjusting the DAC 260 and its effect being seen at the output of the ADC 135; and
4.) Start next iteration by returning to step 1, or finish calibration if the required number of iterations have been completed.

Figure 5:
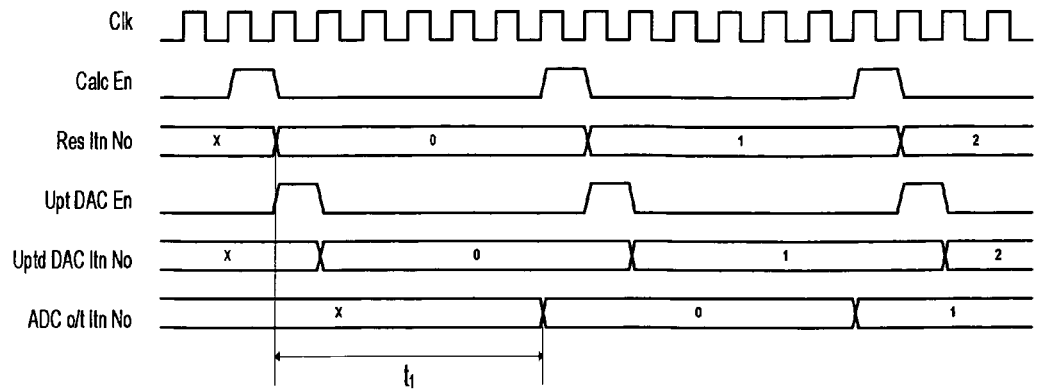

FIG. 5 shows a timing diagram which shows the introduction of a delay between successive calibration iterations. This shows the status of the following registers, from top to bottom respectively, the clock, the loop digits enable, the loop digits results iteration number, the update DAC enable, the updated DAC iteration number and the ADC output iteration number. Time $t_1$ represents the latency from the loop calculation to the result being seen at the ADC 135 output.

After each offset calculation is performed and the DAC 260 values are updated, the digital domain circuitry waits for a number n of cycles such that the result of the DAC 260 update has had time to propagate to the ADC 135 output. Once the previous iteration's result is seen in the ADC 135 output then the next calculation can be performed.

ii.) Loop Gain Factor

The gain factor G of the PGA 130, can be set, for example, in the range of 0.66 to 8: where a 0.66 gain factor represents a PGA code of zero and a gain factor of 8 represents a PGA code of 511 (for a 9 bit digital signal), such values being implementation specific. If the loop gain factor can be adjusted to be unity (in this example), the offset DAC 260 can be set more accurately. This means that a multiplier 230 is required that can multiply by the inverse of the gain factor G, that is can multiply by 1/(G). Making the loop gain factor exactly unity may be difficult due to non-linearity in the PGA 130 and the circuitry required to make a perfect multiplier 230. The circuitry of FIGS. 3a and 3b is arranged therefore to ensure that the loop gain factor is approximately unity whilst using the loop iteratively to reach the desired offset signal value $S_{OSA}$.

Figure 6A:
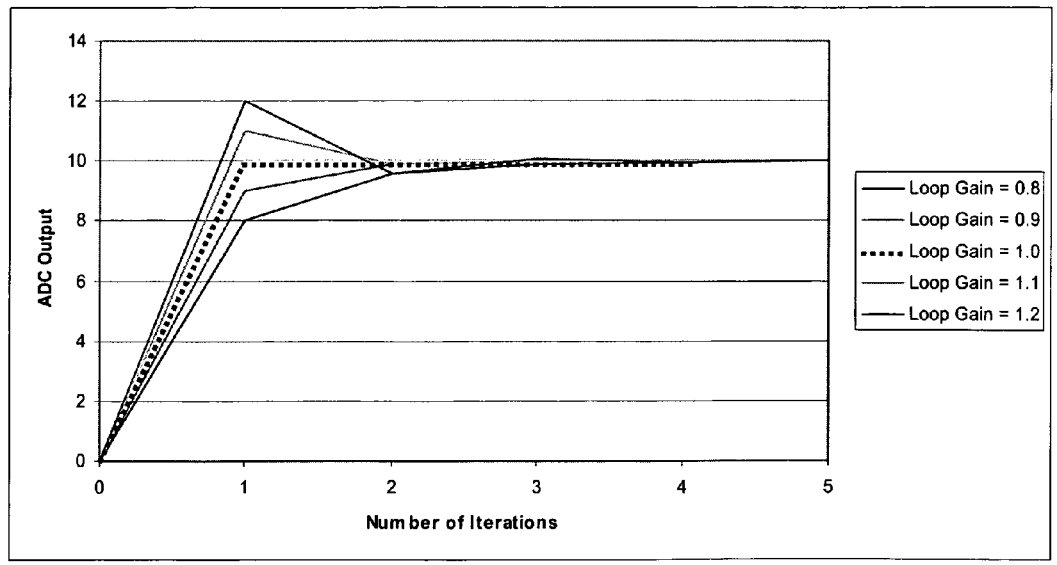
FIG. 6 shows a plot of the ADC output against the number of iterations for loop gains between 0.8 and 1.2.

Ignoring quantisation effects, FIG. 6a shows plots of the ADC 135 output against the number of iterations performed, with a target value of 10, for loop gain factors of 0.8, 0.9, 1.0, 1.1 and 1.2. These plots show that, should the loop gain factor not be exactly unity (but between 0 and 2), due to non-linearity within the loop, the ADC 135 output converges and stops on the desired value within a constrained number of iterations.

Figure 6B:
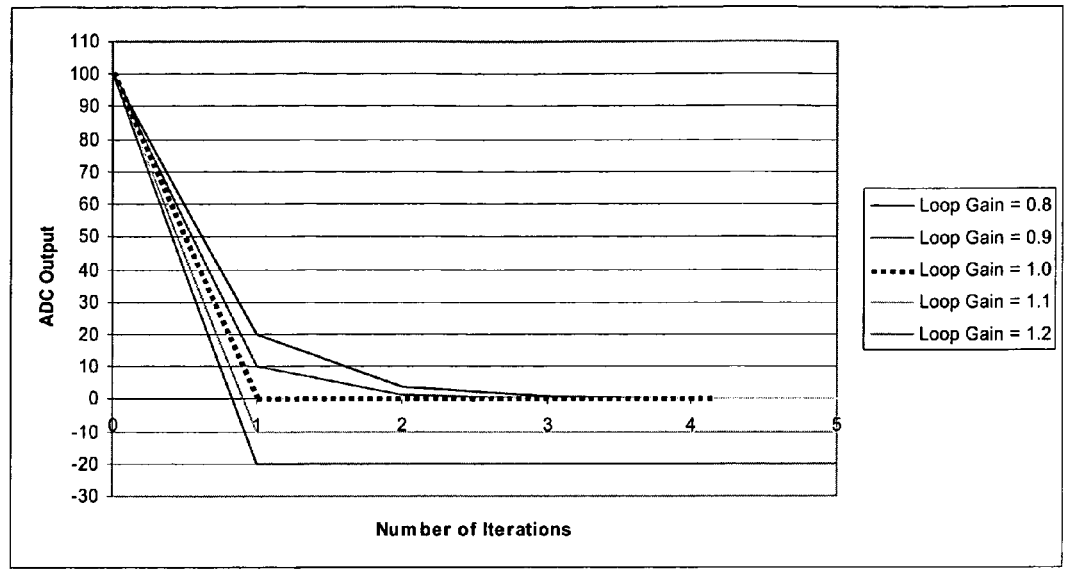
Figure 6C:
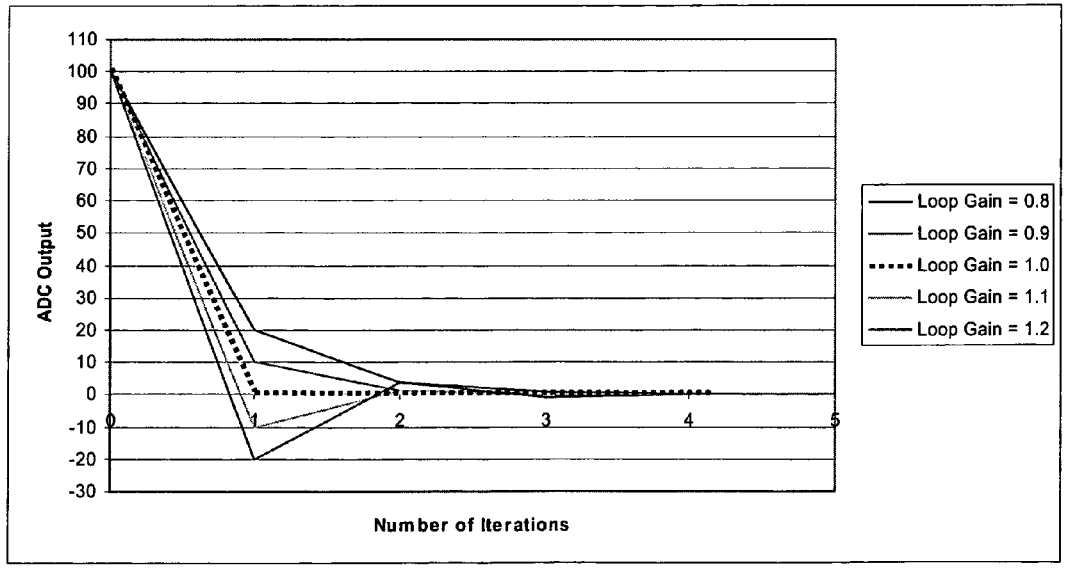

FIG. 6b shows a scenario where the initial ADC 135 output value is equal to one hundred (100) codes with a target black level of 0 for the circuit arrangement of FIG. 3a and for any target black level value for the arrangement of FIG. 3b. It can be seen that a loop gain factor greater than 1 causes the ADC 135 output to become negative on the first iteration of the calibration procedure (in this particular example). If the ADC 135 was unable to represent this negative output code, for example due to clipping, then the calibration period A would not output correct offset signals for the following iterations. If an ADC 135 with over-range was used, such as a pipeline ADC, then negative ADC output data could be used by the calibration circuitry 140 to give performance such as that shown in FIG. 6c.

The fact that the feedback path is tolerant of a loop gain factor differing somewhat from unity means that the multiplier 230 used to introduce the inverse gain (1/G) factor can be "lossy", that is to say inaccurate, and therefore relatively small. Therefore, a shift-add multiplier using a look-up table (LUT) to hold the required coefficients corresponding to the PGA code ($S_{1/G}$) may be used as the digital multiplier 230. This is a particularly efficient way to implement the multiplier 230. A LUT containing coefficients for every possible PGA code ($S_{1/G}$) would give optimal performance. However, it is more practical to take advantage of the loop's tolerance to gains other than unity and reduce the size of the LUT by dividing up the PGA code range into separate regions (the number of regions should be a power of 2 for easy implementation). The resulting gain for the region is calculated from the mean PGA code of that region, as this results in the average loop gain factor of a region being unity.

Figure 7:
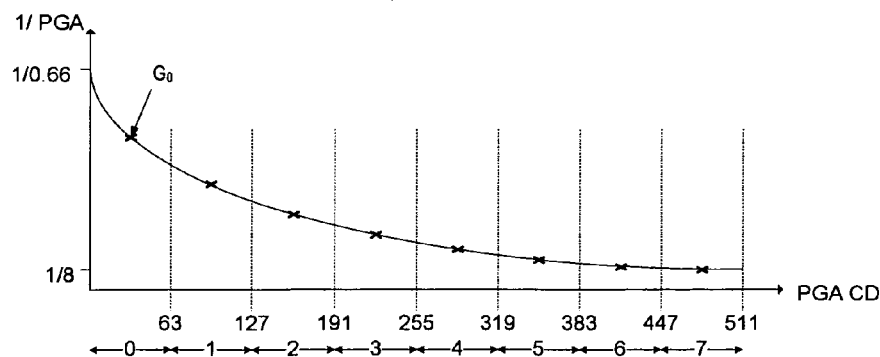
FIG. 7 shows a plot of 1/G against the PGA codes for an eight-region shift-add multiplier that uses a look-up table.

FIG. 7 shows a plot of inverse PGA gain (1/G) against the PGA codes for an eight-region example where the 'x' corresponds to the inverse gain value to be used for that particular region.

Implementing the multiplier in this way reduces the LUT size as only 8 coefficients need to be stored, though this comes at a performance cost. For example, if the PGA code is 0, the ideal inverse gain should be 1/0.66: assuming an example gain of 0.66 for a PGA code equal to zero. However the actual inverse gain used $G_0$ is closer to 1 which means that the total loop gain factor is less than unity. This initially causes the offset DAC 260 to undershoot. Alternatively, the last PGA code in a region will have a total loop gain factor greater than 1 causing the DAC 260 to overshoot. However, provided the regions are small enough to ensure that the loop gain factor never falls outside the operational bounds, for example 0 to 2, then the DAC 260 will always converge towards the desired value.

Figure 8:
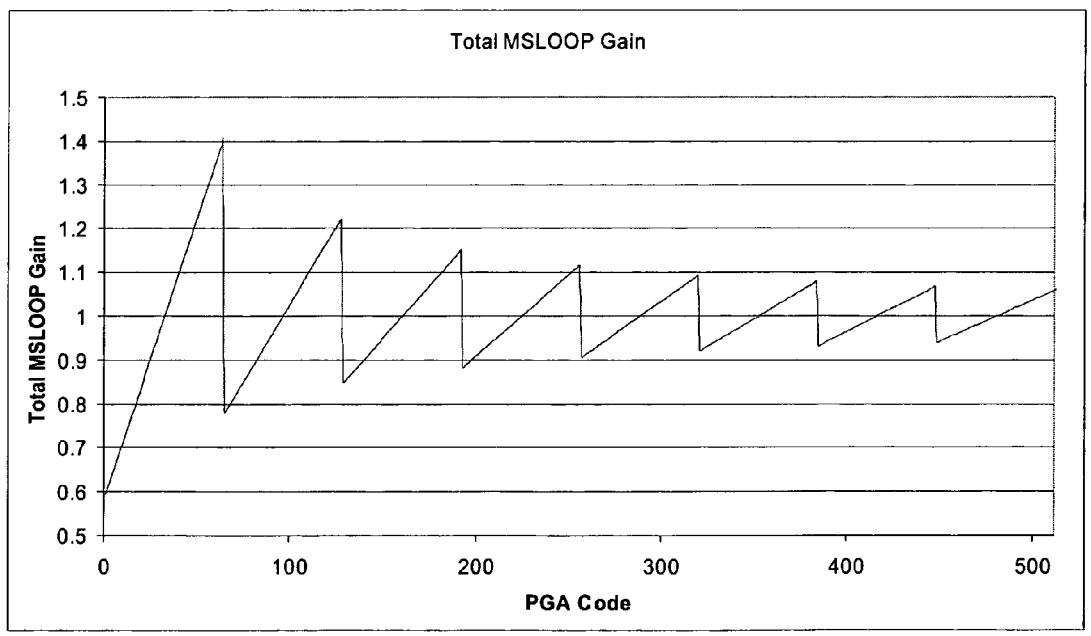
FIG. 8 shows a plot of total loop gain against PGA codes showing the non-linearity of an eight-region multiplier.

FIG. 8 shows the resulting non-linearity of an eight-region multiplier. It should be noted that the loop gain factor always remains, for this example, within its operation bounds (0 to 2) and does not pass above 1.4 or below 0.6. The magnitude of the non-linearity decreases as the number of regions increases, reaching a linear response when the number of regions equals the number of PGA codes.

It should also be noted that the use of a shift-add multiplier 230 introduces a further non-linearity due to the fact that resolution of the coefficients are determined by the maximum shift that is performed. A multiplier 230 that can shift down by up to 10 bits will have higher resolution than one that only shifts by a maximum of 9. The effect of this non-linearity is most noticeable for high PGA codes since the inverse gain 1/G gets smaller and smaller. However, due, once again, to the robustness of the design of the feedback loop, this non-linearity can be accommodated and the ADC 135 output will still converge on the target value over a number of iterations.

Another advantage of the circuit shown in FIG. 3a is that it provides the ability to simply set a target black level at the output of the ADC 135 other than zero. This helps prevent clipping in the ADC 135, even if an ADC 135 without over-range is used. This is simply implemented by incorporating a digital adder 220 in the feedback path which adds the target level to an inverse of the ADC 135 output. In fact, much of the control and implementation of the feedback path is greatly simplified by having the inverse PGA gain (1/G) introduced in the digital domain.

In the circuits of both FIGS. 3a and 3b, the output is set exactly in the digital domain, regardless of any offsets set in the analogue domain. This gives a more accurate offset than circuits which attempt to introduce an output offset by comparing some signal against an analogue target voltage.

It should be noted that the above described embodiments illustrate rather than limit the invention, and that those skilled in the art will be able to design many alternative embodiments without departing from the spirit or scope of the appended claims and drawings. The word "comprising" does not exclude the presence of elements or steps other than those listed in a claim, "a" or "an" does not exclude a plurality, and a single element may fulfil the functions of several elements recited in the claims. It should also be noted that the attenuation, or decrease, of a signal's amplitude is a form of amplification, thus the word "amplify", "amplifying", "amplified" and the like can be taken to mean an increase or a decrease in the amplitude of a signal. Similarly any reference to "gain", "inverse gain" and the like, applied may refer to a gain equal to, less than, or greater than unity being applied (that is the effect of applying "gain" to a signal may result in its replication, attenuation, or amplification). Also any reference to "multiplication", "multiply" and "multiplied" may equally mean division (that is multiplication by an inverse factor) and similarly any reference to "addition", "add" or "adding" may equally mean subtraction. Any reference signs in the claims shall not be construed so as to limit their scope. Furthermore any reference to a signal derived from another signal or an output or input of any device shall be construed to cover a signal either indirectly derived and which has been subject to one or more intermediate operations or to a signal directly derived from said another signal or said output or input of any device. Therefore a second signal derived from a first signal may cover that first signal itself.

The invention claimed is:

1. A circuit for obtaining a calibrated output signal from an input signal, the circuit comprising:

an analogue gain amplifier for applying a variable gain to said input signal;

an analogue to digital converter for converting said input signal to digital form after amplification by said gain amplifier;

a correction circuit for receiving a signal derived from the output of the analogue to digital converter and outputting a digital offset signal;

a digital to analogue converter for receiving said digital offset signal and feeding a corresponding analogue offset signal back to the input of said gain amplifier, such that said correction circuit and said digital to analogue converter form a feedback loop applying an offset to said input signal, wherein said correction circuit includes an inverse gain circuit for applying an inverse gain to a signal within said correction circuit prior to said digital to analogue converter wherein said inverse gain is applied so as to establish a combined gain response applied around said feedback loop within predetermined bounds; and a controller for controlling said inverse gain circuit so as to vary the inverse gain automatically so as to maintain the loop gain factor within said predetermined bounds as the gain of the gain amplifier varies, wherein said controller is arranged to vary the gain of the inverse gain circuit more coarsely than the gain of the gain amplifier and wherein the circuit is operable such that said variation of the loop gain factor around the circuit's feedback loop is restricted within said pre-determined bounds, wherein said pre-determined bounds enable the feedback loop to maintain stability.

2. The circuit as claimed in claim 1 wherein the variation of the loop gain factor around said feedback loop is restricted within substantially 50% of a nominal value to said pre-determined bounds.

3. The circuit as claimed in claim 1 wherein said inverse gain circuit is a shift-add multiplier, the number of possible gain values said shift-add multiplier can apply being a power of two.

4. The circuit as claimed in claim 1 wherein said correction circuit further comprises a digital adder, and a target calibration level is set by addition of a target calibration signal to said signal derived from the output of the analogue to digital converter such that said offset applied to said input signal is dependent on said target calibration level.

5. The circuit as claimed in claim 1 further comprising a digital adder in an output signal path of said circuit, a target calibration level being set by addition of a target calibration signal to said signal derived from the output of the analogue to digital converter, to obtain said calibrated output signal.

6. The circuit as claimed in claim 1, said circuit being arranged to take a number of iterations, if necessary, in order to perform said calibration wherein a pre-determined delay is introduced between successive iterations to allow for latency in the calibration circuit.

7. A circuit for obtaining a calibrated output signal from an input signal, the circuit comprising:
an analogue gain amplifier for applying a variable gain to said input signal;
an analogue to digital converter for converting said input signal to digital form after amplification by said gain amplifier;
a correction circuit for receiving a signal derived from the output of the analogue to digital converter and outputting a digital offset signal;
a digital to analogue converter for receiving said digital offset signal and feeding a corresponding analogue offset signal back to the input of said gain amplifier, such that said correction circuit and said digital to analogue converter form a feedback loop applying an offset to said input signal, wherein said correction circuit includes an inverse gain circuit for applying an inverse gain to a signal within said correction circuit prior to said digital to analogue converter wherein said inverse gain is applied so as to establish a combined gain response applied around said feedback loon within predetermined bounds; and
a controller for controlling said inverse gain circuit so as to vary the inverse gain automatically so as to maintain the loop gain factor within said predetermined bounds as the gain of the gain amplifier varies,
wherein said gain amplifier is a programmable gain amplifier, the gain being dependent on an input coefficient applied to a control input of the calibration circuit, the number of possible gain values that said inverse gain circuit can apply being less than the total number of possible input coefficients for said programmable gain amplifier.

8. The circuit as claimed in claim 7 wherein said controller is arranged to use a look up table in order to select the inverse gain to be applied by reference to the coefficient controlling said gain amplifier, said look up table being divided into regions, with a single inverse gain factor being selected for all the coefficient values in each region.

9. The circuit as claimed in claim 8 wherein said single inverse gain factor for each region is calculated from the mean coefficient value in that region.

10. A method for obtaining a calibrated output signal from an input signal prior to amplification by a variable gain amplifier comprising:
converting the amplified signal to a digital signal;
applying an inverse gain factor to a signal derived from said digital signal to obtain a digital offset signal;
converting said digital offset signal to an analogue offset signal;
using said analogue offset signal to apply an offset to said input signal, thereby to define a feedback loop; and
controlling said inverse gain factor so as to vary the inverse gain automatically so as to maintain the loop gain factor around said feedback loop within predetermined bounds as the gain of the gain amplifier varies, wherein the gain of the inverse gain factor is varied more coarsely than the gain of the gain amplifier and wherein said variation of the loop gain factor around the circuit's feedback loop is restricted within said pre-determined bounds, wherein said pre-determined bounds enable the feedback loop to maintain stability.

11. The method as claimed in claim 10 wherein the variation of the loop gain factor around said feedback loop is restricted within substantially 50% of a nominal value to said pre-determined bounds.

12. The method as claimed in claim 10 wherein said gain amplifier is a programmable gain amplifier, the gain being dependent on an input coefficient the method being such that, when applying the inverse gain factor, the number of possible gain values that can be applied is less than the total number of possible input coefficients for said programmable gain amplifier.

13. The method as claimed in claim 12 wherein a look up table is used in order to select the inverse gain factor to be applied, depending on the value of said input coefficient of the programmable gain amplifier, said look up table being divided into regions, with a single inverse gain factor being selected for all the coefficients in each region.

14. The method as claimed in claim 13 wherein said single inverse gain factor for each region is calculated from the mean coefficient in that region.

15. The method as claimed in claim 10 wherein the number of possible gain values that can be applied is a power of two, said inverse gain factor being applied using a shift-add multiplier.

16. The method as claimed in claim 10 wherein a target calibration level is set by addition of a target calibration signal to said signal derived from the output of the analogue to digital converter such that said offset applied to said input signal is dependent on said target calibration level.

17. The method as claimed in claim 10 wherein a target calibration level is set by addition of a target calibration signal to said signal derived from the output of the analogue to digital converter, to obtain said calibrated output signal.

18. The method as claimed in claim 10, wherein a number of iterations are taken, if necessary, in order to perform said calibration and a pre-determined delay is introduced between successive iterations to allow for latency in the calibration circuit.

19. The method as claimed in claim 10 specifically performed to set a black level offset for image processing said calibration being performed while specifically designated black pixels are being scanned.

* * * * *